United States Patent [19]

Im et al.

[11] Patent Number: 4,828,875

[45] Date of Patent: May 9, 1989

[54] PROCESS FOR THE PRODUCTION OF SINTERED FILMS OF $CD_{1-x}ZN_xS$

[75] Inventors: Ho-Bin Im; Kyu-Charn Park, both of Seoul, Rep. of Korea

[73] Assignee: Korea Advanced Institute of Science & Tech., Seoul, Rep. of Korea

[21] Appl. No.: 170,326

[22] Filed: Mar. 18, 1988

[30] Foreign Application Priority Data

Sep. 25, 1987 [KR] Rep. of Korea ............ 10623/87

[51] Int. Cl.[4] ............................................. H01C 31/00
[52] U.S. Cl. ................................... 427/74; 136/260
[58] Field of Search ........................... 136/260; 427/74

[56] References Cited

PUBLICATIONS

19th IEEE Photovoltaic Specialist Conf., New Orleans, LA, 5/4-8 1987, Pub. 10/87.

Primary Examiner—Sam Silverberg
Attorney, Agent, or Firm—Harry M. Cross, Jr.

[57] ABSTRACT

Sintered films of $Cd_{1-x}Zn_xS$ ($0 \leq x < 1$) with high optical transmittance are provided. These films are produced by applying a paste composed of powdered CdS and $CdCl_2$ or of a mixture of CdS, ZnS and $CdCl_2$ onto an appropriate substrate such as borosilicate glass, under an inert gas atmosphere containing $ZnCl_2$ vapor or thereafter resintering the paste on the substrate under a nitrogen atmosphere.

The $ZnCl_2$ vapor is produced by heating $ZnCl_2$ at 400° C. or higher but below the temperature of 500°–700° C. to which the specimen is heated.

The resulting sintered films have optical transmittance of 80% at long wavelength ranges or higher and can be used as a window layer having a superior optical transmittance in solar cells.

4 Claims, 2 Drawing Sheets

PROCESS FOR THE PRODUCTION OF SINTERED FILMS OF $CD_{1-x}ZN_xS$

BACKGROUND OF THE INVENTION

1. Field of the Invention

The present invention relates to a process for the production of sintered films of $Cd_{1-x}Zn_xS$ ($0 \leq x < 1$) having high optical transmittance which may be used for window layers in solar cells. More particularly, the invention relates to a process for preparing sintered films under a $ZnCl_2$ atmosphere. The process may include the step of resintering films which have first been sintered under a $ZnCl_2$ atmosphere.

2. Description of the Prior Art

It is well known in the art of film type solar energy cells, such as CdTe, $CuInSe_2$, $Cu_2S$ and the like to use different semiconductor films having an energy gap (band gap) greater than that of the light absorbing layer (CdTe, etc.) and that improved optical transmittance considerably enhances the performances of such cells. (References 1-3) $Cd_{1-x}Zn_xS$ is useful as a window material, and its energy gap and lattice constant may vary depending upon the composition thereof, that is, at different values of x. (Reference 4) Many methods for obtaining sintered films x is 0 (i.e., CdS) have been devised and proposed. (References 5,6) However, these methods do not apply to the production of the sintered films of $Cd_{1-x}Zn_xS$ having high optical transmission wherein x is greater than 0. (Reference 7)

The above references 1-7 are incorporated into this specification as a part of the present invention. These references are identified in the detailed description of the preferred Embodiments.

In general, the sintered film of CdS (x=0) is prepared by adding a suitable binder to a mixture of CdS power and $CdCl_2$ powder to form a paste composition, and applying the paste onto a proper substrate, followed by sintering thereof at a high temperature. However, when a sintered film of $Cd_{1-x}Zn_xS$ is prepared by adding ZnS powder at the stage of the initial compounding of the paste in the same manner as in the method of producing the sintered film of CdS, an undesirable microscopic structure is created and, thus, it is difficult to obtain sintered films with high optical transmittance.

SUMMARY OF THE INVENTION

The object of the invention is to provide a process for the production of a sintered film of $Cd_{1-x}Zn_xS$ having high optical transmittance by means of a sintering method.

This and other objects of the invention can be attained by adding powdered $CdCl_2$ to powdered CdS or to a mixture of powdered CdS and ZnS to give a paste, applying the paste onto an appropriate substrate and sintering the paste on the substrate under an inert gas atmosphere containing $ZnCl_2$ vapor. Alternatively, the sintered material may be resintered under a nitrogen atmosphere, if desired.

DESCRIPTIONS OF THE DRAWINGS

The present invention will be understood more fully from the detailed description given hereinbelow and the accompanying drawings of the preferred embodiment of the invention.

FIG. 1 is a device for use in the production of sintered films of $Cd_{1-x}Zn_xS$; and FIG. 2 is a graph showing a comparison of the optical transmittance of the sintered films of $Cd_{1-x}Zn_xS$ produced by a prior art method and those prepared according to the invention.

DETAILED DESCRIPTION OF THE INVENTION

Figure 1:
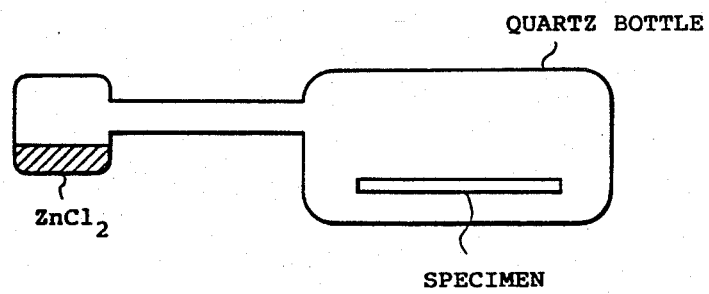

A mixture of CdS and appropriate amounts (depending upon the desired composition of the sintered film) of ZnS and $CdCl_2$ is first prepared and then a suitable binder such as propylene glycol is added to the mixture to produce a paste. This paste is applied onto the surface of a substrate such as borosilicate glass and is then dried to remove the binder. The resulting specimen is placed into a specially designed device as shown in FIG. 1 and heated to a temperature of 500°-700° C. Subsequently, the specimen is sintered under an inert gas atmosphere by adjusting the temperature of $ZnCl_2$ to 400° C. or higher but below that of the specimen. At this stage, the $ZnCl_2$ is heated and its vapor is applied to the specimen.

Further, when the temperature of the $ZnCl_2$ is altered, its vapor pressure is also changed. Accordingly, the reaction rate and direction are altered as shown below and, thus, it is quite possible to control the concentration of the constituents of the sintered film (i.e., the concentration of Zn) by means of adjusting the temperature of the $ZnCl_2$.

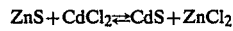

$$ZnS + CdCl_2 \rightleftharpoons CdS + ZnCl_2$$

In addition, the amount of the $CdCl_2$ which remains is determined by the amount of ZnS added and the vapor pressure of the $ZnCl_2$. Therefore, the higher the vapor pressure of the $ZnCl_2$, the greath the amount $CdCl_2$ remains and thereby the worse the microscopic structure of the spcimen is. In such a case, the specimen must further be sintered at a temperature of 500°-700° C. under an inert gas atmosphere to endow the specimen with high optical transmissivity.

DESCRIPTION OF THE PREFERRED EMBODIMENTS

The invention will be described below in greater detail by way of the following non-limiting examples.

EXAMPLE 1

Ten percent by weight of powdered $CdCl_2$ was added to 90% by weight of highly pure powdered CdS. Propylene glycol was then mixed with these compounds as a binder to obtain a paste. This paste was then applied onto a borosilicate glass substrate, which was then dried in air. The resulting specimen was sintered for an hour with the temperature of the $ZnCl_2$ maintained at 550° C. and that of the specimen at 600° C., to give a sintered film of $Cd_{0.9}Zn_{0.1}S$. This film has an average optical transmittance of 87% to long wave-length light of 600–1,000 nm and was 16 $\mu$m in thickness.

COMPARATIVE EXAMPLE 1

A paste having the same composition as that of Example 1 was prepared and the procedures in Example 1 were repeated, except that the resulting specimen was sintered under a nitrogen atmosphere without the $ZnCl_2$ vapor. A sintered film of CdS having a thickness of 18.5 $\mu$m and an average optical transmittance of 80% to long wave-length lights was obtained.

EXAMPLE 2

Example 1 was repeated except that 10 mol% of ZnS was added to the initial paste. The resulting sintered $Cd_{0.85}Zn_{0.15}S$ film had a thickness of 18.5 μm and an average transmittance of 80% to long wavelength lights.

COMPARATIVE EXAMPLE 2

Example 1 was repeated except that 10 mol% after sintering of ZnS was added to the initial paste. The resulting $Cd_{0.97}Zn_{0.03}S$ has a thickness of 19.5 μm and an average optical transmittance of 70% to long wavelength lights. The addition of 25 mol% of ZnS gave a sintered film of $Cd_{0.89}Zn_{0.11}S$ having a thickness of 30 μm and an average transmittance of 57% to long wavelength lights. The reason that the film thickness of these specimens is greater than that of Example 1 is not considered to be due to the differences in the thickness thereof before sintering, but to the differences in density after the sintering.

EXAMPLE 3

A specimen A was obtained by applying a paste containing 10 mol% of ZnS onto the same substrate used in Example 1 and a specimen B was obtained by applying a paste containing 25 mol% of ZnS onto the substrate. These specimens were each sintered in the presence of the $ZnCl_2$ maintained at a temperature of 560° C. During the processing, each of the specimens was maintained at 600° C., and was then further sintered for 2 hours at 600° C. in nitrogen.

The resulting sintered films of $Cd_{0.87}Zn_{0.1}S$ (A) and $Cd_{0.79}Zn_{0.21}S$ (B) had a thickness of 18 μm and transmittances of 87% (A) and 82% (B) respectively.

As can be seen from Examples 1 to 3 and Comparative Examples 1 and 2 above, when the specimens processed in accordance with the present invention are compared with those sintered conventionally under an inert gas atmosphere such as nitrogen, the $Cd_{1-x}Zn_xS$ film sintered under an atmosphere containing $ZnCl_2$ vapor produces a film of higher optical transmittance. In addition, the film sintered under a $ZnCl_2$ atmosphere may be resintered under a nitrogen atmosphere in order to increase further the optical transmittance. In practice, when the layers with higher optical transmittance are used in solar cells, the efficiency of the solar cells is increased.

Figure 2:
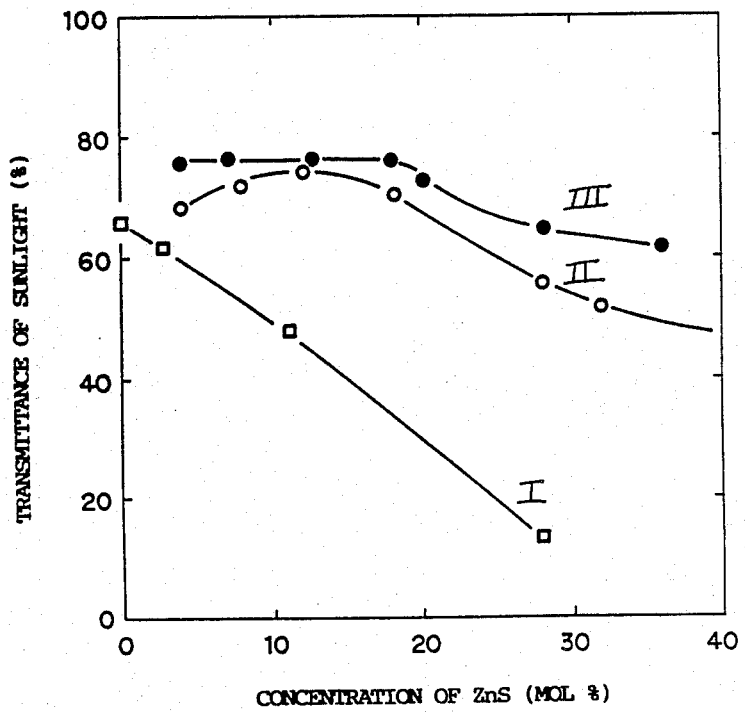

FIG. 2 shows a graph demonstrating how much sunlight of 1.1 eV or more (in percent) is transmitted through each of the following three specimens: first, a specimen sintered under an inert gas atmosphere in accordance with the prior art (Curve I), second, a specimen sintered under a $ZnCl_2$ atmosphere in accordance with the invention (Curve II), and third, a specimen resintered under a nitrogen atmosphere after having been sintered under a $ZnCl_2$ atmosphere in accordance with the invention (Curve III). From these data, it is evident that both the specimen sintered under a $ZnCl_2$ atmosphere and the specimen resintered under a nitrogen atmosphere after having been sintered under a $ZnCl_2$ atmosphere are capable of transmitting a greates amount of sunlight than the specimen sintered under an inert gas atmosphere.

REFERENCES

1. A. L. Fahrenbruch and R. H. Bube, "Fundamentals of Solar Cells," Academic Press, New York—London, (1983) pp. 483-496.

2. R. A. Mickelsen, W. S. Chen, Y. R. Hsiao, and V. E. Lowe, "Polycrystalline Thin-Film $CuInSe_2/CdZnS$ Solar Cells" IEE Trans. ED-31, pp. 542-546, 1984.

3. R. B. Hall, R. W. Birkmire, J. E. Phillips, and J. D. Meakin, "Thin-film Polycrystalline $Cu_2S/Cd_{1-x}Zn_xS$ Solar Cells of 10% Efficiency." Appl. Phys. Letter, 38, pp. 925-926, 1981.

4. W. M. Kane, J. P. Spratt, L. W. Hershinger, and I. H. Khan, "Structural and Optical Properties of Thin Films of $Cd_{1-x}Zn_xS$," J. Electrochem. Soc., 113, pp. 136-138, 1966.

5. H. Uda, H. Matsumoto, K. Kuribayashi, Y. Komatsu, A. Nakano, and S. Ikegami, "Effect of Resistivity of CdS Sintered Film on Photovoltaic Properties of Screen-Printed CdS/CdTe Solar Cells," Jpn. J. Appl. Phys., 22, pp. 1832-1836, 1983.

6. H. G. Yang and H. B. Im, "Preparation and Properties of Sintered CdS Films," J. Electrochem. Soc., 133, pp. 479-485, 1986.

7. Y. S. Seol and H. B. Im, "Sintering Behaviors and Electrical Properties of $Cd_{1-x}Zn_xS$ Films Containing $CdCl_2$," J. Mater. Sci. (in printing).

What is claimed is:

1. A process for the production of sintered films of $Cd_{1-x}Zn_xS$ ($0<x<1$) in which a paste composed of powdered CdS and $CdCl_2$ or of a mixture of powdered CdS, ZnS and $CdCl_2$ is applied onto a substrate and the substrate is subjected to sintering, which process comprises using an inert gas containing $ZnCl_2$ vapor as a sintering atmosphere.

2. The process of claim 1, wherein $ZnCl_2$ is heated to 400° or greater but less than 700° C.

3. The process of claim 1, wherein the resulting $Cd_{1-x}Zn_xS$ film is resintered under an inert gas atmosphere.

4. The process of claim 2, wherein the resulting $Cd_{1-x}Zn_xS$ film is resintered under an inert gas atmosphere.

* * * * *